United States Patent [19]

Nystrom

[11] Patent Number: 4,764,720

[45] Date of Patent: Aug. 16, 1988

[54] APPARATUS AND METHOD FOR MEASURING VARIABLE FREQUENCY POWER

[75] Inventor: Robert W. Nystrom, Oxford, Mass.

[73] Assignee: Load Controls Incorporated, Sturbridge, Mass.

[21] Appl. No.: 77,009

[22] Filed: Jul. 22, 1987

Related U.S. Application Data

[63] Continuation of Ser. No. 805,356, Dec. 5, 1985.

[51] Int. Cl.$^4$ ............... G01R 21/08; G01R 21/14
[52] U.S. Cl. ............... 324/107; 324/105; 324/142
[58] Field of Search ............... 324/77 H, 102, 107, 324/117 H, 140 R, 141, 142; 323/294, 368; 364/483

[56] References Cited

U.S. PATENT DOCUMENTS

| | | | |
|---|---|---|---|
| 3,343,084 | 9/1967 | Gambale et al. | 324/142 |
| 3,886,449 | 5/1975 | Wolfinger | 324/142 |
| 3,921,069 | 11/1975 | Milkovic | 324/142 |
| 3,951,389 | 4/1976 | Porter | 364/483 |
| 4,423,374 | 12/1983 | Hansen, Jr. | 324/140 R |
| 4,485,343 | 11/1984 | Milkovic | 324/142 |
| 4,608,533 | 8/1986 | Starkie | 324/142 |
| 4,628,257 | 12/1986 | Husters et al. | 324/142 |

FOREIGN PATENT DOCUMENTS 0718797  2/1980  U.S.S.R. ............... 324/142

OTHER PUBLICATIONS

"Hall Probe Monitors High Voltages", by Warner, Electronics Product Design, 10/80, p. 22, cl. 324-117 H.

F. W. Bell, "Industrial Watt Transducers", PX-2000 and 4000 series Subsidiary, Magnetics & Electronics, Inc.

F. W. Bell, "Current/Watt Sensors", PI Series An Allegheny International Company.

Kasuga E. W. Ltd., "Escon", KVFN series.

Borg-Warner Electronics Corporation, "Power Plus AC Drive", pp. 1-8.

Primary Examiner—Reinhard J. Eisenzopf
Assistant Examiner—W. Burns
Attorney, Agent, or Firm—Lorusso & Loud

[57] ABSTRACT

Disclosed is an apparatus and method for sensing power in a variable frequency machine. The power is sensed in each phase of the three phase machine by utilizing Hall generators for multiplying the phase current flowing through each phase by a current proportional to a phase voltage for each phase. The products are then summed to obtain a reading of the instantaneous power drawn by the three phase machine. The AC component is filtered out of the summed signal using a multi-stage filter which allows for maintaining of a fast response time with low ripple. In a preferred embodiment, a four stage filter utilizing R.C. filters is employed for this purpose.

3 Claims, 2 Drawing Sheets

APPARATUS AND METHOD FOR MEASURING VARIABLE FREQUENCY POWER

This is a continuation of co-pending application Ser. No. 805,356, filed on Dec. 5, 1985.

BACKGROUND OF THE INVENTION

The present invention relates to an apparatus and method for measuring power and more particularly to an apparatus and method for measuring variable frequency power in a three phase AC machine.

Adjustable speed drives have been in use for several years, and they are widely used for controlling the speed of induction motors. Such adjustable speed drives offer several advantages over fixed speed drives. For example, adjustable speed drives will increase the productivity of industrial machines since the machine speed can be selected for maximum output consistent with good product quality. Adjustable speed drives will also make industrial machines more flexible so that when a product change requires a different drive speed, the new speed is easily selected. This benefit eliminates the need for gear or belt ratio changes. Furthermore, electronic adjustable speed drive systems together with process or programmable controllers enable the controlling of machine speed, fan speed or pump speed thereby further increasing the productivity and versatility of any machine utilizing such adjustable frequency drives.

In general, motor speed can be controlled by varying factors such as line frequency, the number of motor poles, and motor slip. By controlling the motor speed by varying the frequency, a continuously variable, highly efficient control throughout the entire speed range may be achieved. Furthermore, such a control system is applicable to widely used, three-phase squirrel-cage motors.

Variable frequency may be provided to input terminals of an AC motor in the following manner. A main three-phase supply is first rectified and smoothed in a rectifier or converter section. This DC power is then fed into an inverter section, the current output of which is a sine wave of variable frequency and amplitude. To control the speed and torque of a three-phase, squirrel-cage motor it is necessary to modify the output voltage in proportion to the output frequency to obtain the required torque at a specific speed.

Two different methods of obtaining the variable frequency output may be used. In a six step system (PAM), the DC voltage obtained in the converter is varied. In a Pulse Width Modulation system (PWM), the frequency and the voltage are controlled by varying the pulse width within the inverter. The current output of the PWM system is a sine wave and has far superior form to output waveforms produced by the PAM system. For both types of systems, the goal is to generate a current waveform that approaches sinusoidal with the harmonic components of the waveform at a minimum to ensure minimized torque pulsation and temperature rise. In neither case, however, has this goal been completely met by known devices.

In many situations, the effectiveness of a drive can be further increased by accurately measuring the power output. Measuring the instantaneous power input to a machine or process provides a great deal of valuable information. This measurement which can be used as a feedback signal may be utilized to: automatically adjust the machine feedrate; signal the beginning or end of a process; detect malfunctions or problems; and, indicate, without contact, the flowrate, viscosity or pressure.

Load controls that sense power, have set points and analog outputs are widely used in machine tools, chemical processes and material handling. Unfortunately, such load controls do not work on variable frequency sources. In order for a variable frequency power sensor to be of practical use as a machine controller, the sensor must have the ability to: accurately measure power at both low and high frequencies; provide a fast response with low ripple and immunity to noise; and, have the capability of working on both pulse amplitude modulation drives and pulse width modulation drives.

The main use of variable speed drives is to power induction motors. To measure this power, the lag of the current behind the voltage (or power factor) must be considered. Traditional watt sensors rely on sensing the zero crossing of the sinusoidal voltage and current for power factor calculation. Typical waveforms from PWM and PAM drives show that the waveform is not clean enough for precise zero crossing measurement. A secondary problem is the measurement of current. Many sensors use a current sensing torroid or a lamination transformer, but these devices are not reliable at low frequencies. The combination of zero crossing and current measuring difficulties means that typical watt transducers do not work on the output of a variable frequency drive.

The measurement of AC power requires the multiplication of voltage, current and a power factor so that the equation is:

$$P = V \times I \times \cos \phi$$

A simple and reliable method for performing this computation electronically is by means of a Hall generator. A Hall generator is a magneto-sensitive semiconductor which, when driven by an electric current and exposed to a magnetic field, generates a voltage that is proportional to the product of current and field. To utilize a Hall generator to measure power, a Hall device excitation current I is derived from a line voltage, and the phase load current produces a proportional field B in the magnetic circuit. The Hall generator exposed to this field generates an output voltage proportional to the product of I, B, and the phase angle between them. The output contains an AC component and a DC component. The AC component can be filtered out if necessary, and the expression for the DC component is $V = k \times I \times B = k \times V \times I \cos \phi = k \times P$ where k is a constant representing the Hall voltage. The DC output voltage is therefore a measure of the AC power. With such traditional power measurements as described above, only one or two phases are measured, and as a result, there is a large ripple component in the resulting output.

In three-phase power measuring devices which are used for fixed frequency power sensors, either one or two transducers are utilized to measure either one phase under the assumption that the load is balanced or two phases, respectively. A computer simulation of either of these approaches at various power factors shows that the output would have a large ripple component which is unacceptable for control operations.

For many control applications, fast response is also critical. Typical response time for watt transducers is 250 to 500 milliseconds. The slow response is due in great part to filtering circuits. For a power sensor to be useful, the response times should be reduced to about 15 milliseconds.

A power transducer must also live in close proximity to the variable frequency drive, and such drives generate a great deal of RF noise from the high frequency switching. Therefore, both the housing of the sensor and the internal circuitry should be designed to minimize RF noise.

It is therefore a principal object of the present invention to provide an apparatus and method for sensing variable frequency power that is accurate, reliable and which provides an output signal that does not exhibit a large ripple component.

It is another object of the present invention to provide an apparatus and method for measuring variable frequency power which will be sensitive at both low and high frequencies and will provide a fast response time.

A further object of the present invention is to provide an apparatus and method for measuring variable frequency power which will provide independent and precise machine control and protection.

A still further object of the present invention is to provide an apparatus and method for sensing variable frequency power which will provide a linear output and which is extremely forgiving to gross overloads.

SUMMARY OF THE INVENTION

In accordance with the objects of the invention, an apparatus and method for measuring variable frequency power includes a means for measuring power in each phase of a three-phase machine. The power is measured by taking the phase voltage from each phase, and converting the voltage into a control current. This control current and the appropriate phase current is then utilized to drive a Hall generator so that the Hall generator multiplies the control current signal and the phase current signal to obtain an output signal that represents power ($V \times I \cos \phi$) in that particular phase. The power measurements from the three phases are summed to provide a measurement of the instantaneous power drawn by the three-phase machine. This power signal includes an AC component which is filtered out by a multi-stage filter which allows the apparatus to maintain a rather fast response time. Preferably, this multi-stage filter utilizes RC filters to perform the filtering operation.

These and other features and objects of the present invention will be more fully understood from the following detailed description which should be read in light of the accompanying drawings in which corresponding reference numerals refer to corresponding parts throughout the several views.

DETAILED DESCRIPTION OF THE PREFERRED EMBODIMENT

Figure 1:
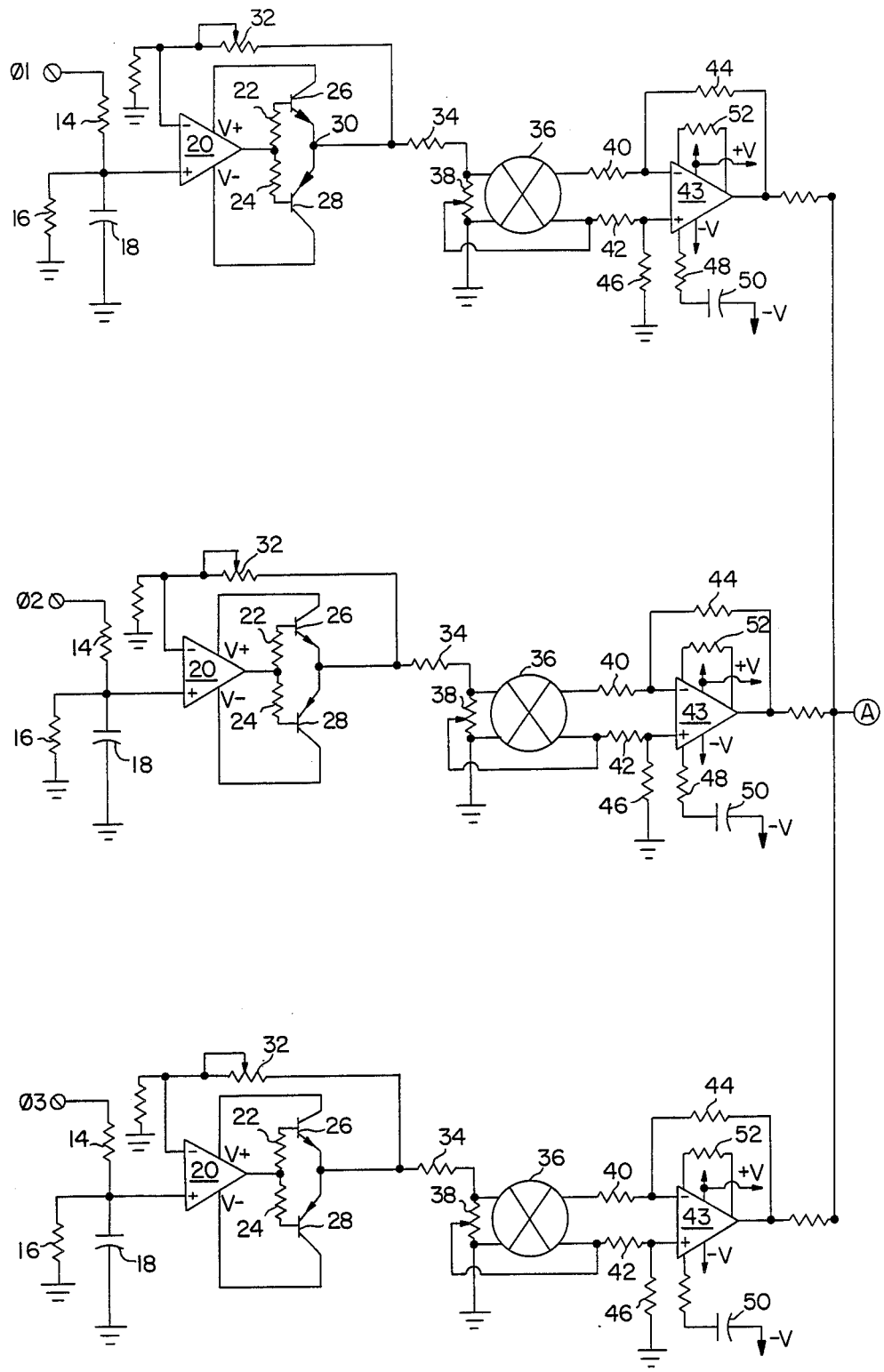
FIG. 1 is a schematic diagram of the circuitry for obtaining the power measurement in each of the three phases of the power sensor of the present invention.
Figure 2:
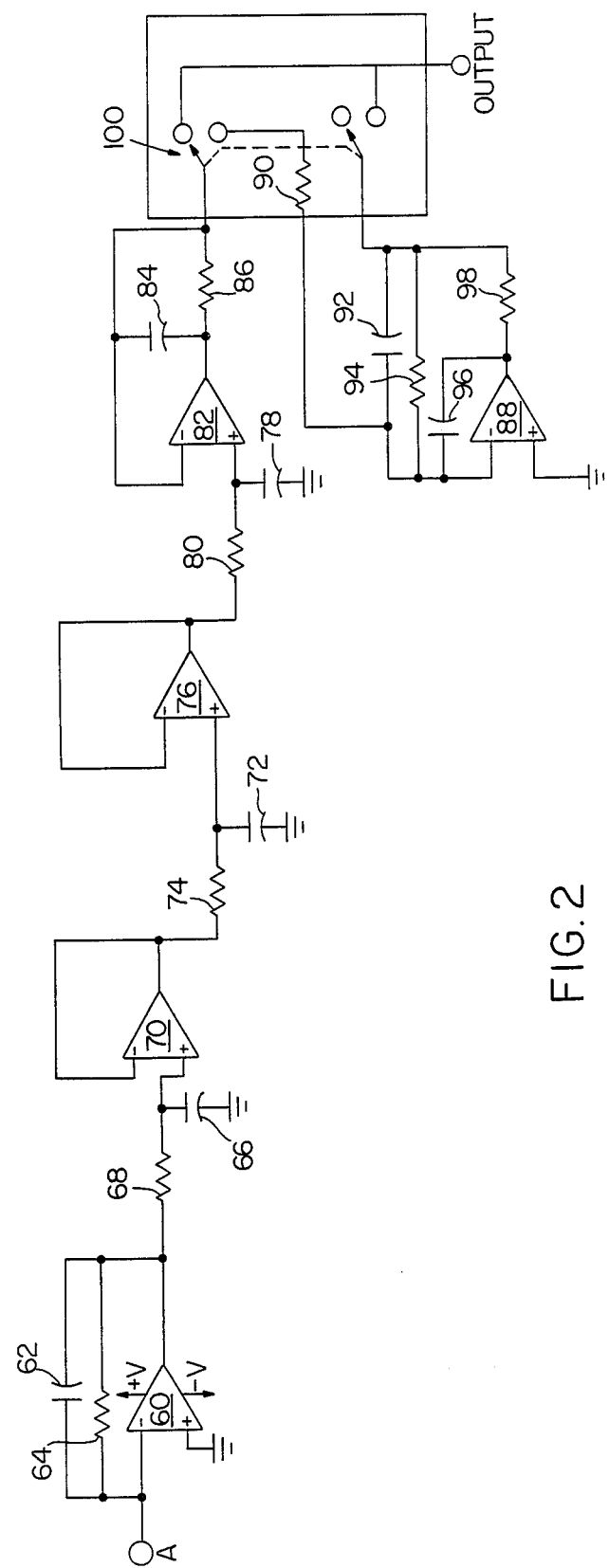
FIG. 2 is a schematic diagram of the multi-stage filter of the power sensor of the present invention.

Referring to FIGS. 1 and 2, the variable frequency power sensor of the present invention obtains a measure of a variable frequency power by independently measuring the power in each of the three phases and then summing the three power values. By measuring all three phases, the ripple is substantially reduced. The AC component of the resulting power measurement is filtered from the output by a multi-stage filter which is principally shown in FIG. 2.

Turning first to the phase measuring circuitry principally shown in FIG. 1, while the excitation for a Hall generator may be derived directly from phase voltage for a particular phase of a multi-phase machine by a voltage to current converting resistor, several problems would result with such a circuit. Principally, high power dissipation would occur, and there would be a high and potentially lethal leakage current since the current to ground from each phase is the excitation of the cell (typically 40 mA). To avoid these two problems, a high value resistor 14 is provided to limit the leakage current to microamps, and as a result, the circuit will exhibit a low power dissipation (approximately 0.25 watts). Resistor 14 will also facilitate the normalizing of the range voltage with the divider resistor 16. Capacitor 18 is provided to supply high frequency noise filtering and op-amp 20 which is characterized by a high breakdown voltage and good common mode characteristics will also have a slew rate which will provide some high frequency noise filtering. Only a minimal amount of filtering is required to preserve the accuracy of the reproduced waveform presented to the Hall cell. A LM324 operational amplifier as manufactured by National Semiconductor is suitable for this purpose.

The op-amp 20 output is sent through resistors 22, 24 to the base of transistors 26, 28 which are provided to buffer the op-amp output transistors. The output from the two transistors are combined at summing point 30, and this output signal provides a negative feedback voltage through variable resistor 32 to the inverting input of the op-amp 20. The feedback resistor 32 is a variable resistor because this resistor is used for Hall cell calibration. The output voltage from the summing point 30 passes through resistor 34 which may be a temperature compensating resistor for Hall cell stabilization. Resistor (and consequently gain) values are computed to prevent damage to the Hall cell from gross overloads.

The Hall generator 36, which is supplied with the total current of a particular phase, is modulated by the appropriate excitation current to produce a power proportional signal. A suitable Hall device will saturate at a fixed current, and an example of such a Hall generator is that manufactured by FW Bell under the designation PI100 or PI350.

Variable resistor 38 balances the bridge voltage of the Hall cell 36 and the variable resistor 38 may be calibrated dynamically by oscilloscope observation of $\sin^2 \omega t$. Output voltages of the Hall cell 36 are supplied through resistors 40 and 42 to the inverting and non-inverting inputs of op-amp 43 respectively. Op-amp 43 is a low noise, high speed op-amp which is configured for differential gain to take advantage of common mode rejection. A suitable op-amp would be a LM725 manufactured by National Semiconductor. Resistors 44 and 46 are selected to set an appropriate gain, and the combination of resistor 48 and capacitor 50 set compensation and provide a certain amount of filtering. Resistor 52 nulls the amplifier 43. The output of the amplifier 43 provides a signal representing the power in the particular phase to which it is connected.

The phase signals from each of the three phases must be summed, and amplifier 60 is provided for this purpose. As discussed above, the AC component must be filtered from the output wave, and once the signals from three phases are summed by amplifier 60, the voltage signal representing the sum is filtered to remove the AC component. In order to maintain a fast response time, a multi-stage filter is utilized which will provide a response time of approximately 15 milliseconds. The first stage of filtering is effected by an RC filter circuit comprising capacitor 62 and resistor 64. Op-amp 60 will provide a voltage source signal for the next RC stage comprising capacitor 66 and resistor 68. By utilizing the amplifier 60 to provide the voltage source for the RC filter comprising capacitor 66 and resistor 68, the overall construction is simplified and the attenuation effects normally associated with multi-stage RC filters are thereby reduced. In the preferred embodiment shown in FIG. 2, there are four stages of filtering which will enable the rapid decrease of ripple per stage with a very slow increase in the response time. In the remaining filtering stages, amplifier 70 provides a voltage source for the RC circuit comprising capacitor 72 and resistor 74, and op-amp 76 will feed a voltage signal to the RC circuit comprising capacitor 78 and resistor 80. Amplifier 82 is used to buffer the last filter stage, and the RC circuit comprising capacitor 84 and resistor 86 is provided to increase the stability phase margin when driving long capacitive cables.

In a preferred embodiment there are two output signal modes. One will provide an output from 0 to approximately −7 volts which is used for additional signal processing by other "black boxes". If the device is used for a regenerative motor, the polarity reverses to 0 to +7 volts full scale. In a stand-alone mode which is used for power indication only, amplifier 88 is provided for transducer output scaling and additional filtering. Resistors 90 and 94 set the gain and therefore the scaling along with inverting amplifier 88. Resistor 90 and the equivalent of DPDT switch 100 is located on a plug-in module. Switch 100 selects whether the output signal comes from amplifier 82 or 88. Resistor 94 and capacitor 92 provide one more stage of filtering in the transducer stand alone mode. Resistor 98 and capacitor 96 decouple amplifier 88 from capacitive loads. Scaling may be provided by a plug-in module as well as by model selection. Typically, the output is scaled to 0 to +10 volts or 0 to +5 volts full scale. Polarity reverses (0 to −10 volts, 0 to −5 volts full scale) for regenerative motors.

With respect to the power supply for the present invention, any conventional power supply may be utilized. In one embodiment, the power supply may be a split supply which will provide for op-amp ripple rejection and optimization of common mode rejection in amplifiers 43. Rail voltages can be chosen to provide low dissipation for the op-amps and to limit the output signal in the event of gross overloads through the Hall cell. This allows the Hall cell 36 to be greatly undersized to provide maximum sensitivity at a small part of the machining cycle without the fear of damage at higher normal cycle loads.

While the foregoing invention has been described with reference to its preferred embodiments, various alterations and modifications may occur to those skilled in the art. All such alterations and modifications are intended to fall within the scope of the appended claims.

What is claimed is:

1. A power sensor for sensing power through a wide bandwidth of frequencies, continuously and automatically, at any moment in time in a three-phase AC machine to produce a resulting signal, said resulting signal representing sensed variable power being a continuous analog function, said power sensor producing said signal within milliseconds, said sensor comprising:

means for measuring power in each phase of said threephase AC machine, said means for measuring power being capable of measuring a sinusoidal wave shape, wave shapes other than sinusoidal and distorted waveshapes while maintaining sensitivity at high and low frequencies, said means for measuring power including:

means for detecting a phase current from said phase of said three-phase AC machine to obtain a phase current signal;

means for detecting a phase voltage from said phase of said three-phase AC machine to obtain a phase voltage signal;

means for amplifying said phase voltage signal, said means for amplifying said phase voltage signal also acting to convert said phase voltage signal into a control current proportional to the phase voltage signal in amplitude and phase, said control current temperature compensatable by a temperature compensating resistor; and a Hall generator driven by said control current for sensing a magnetic field generated by said phase current signal, said Hall generator providing an output signal indicative of instantaneous power drawn by said phase of said three-phase AC machine;

said three-phase AC machine providing a summed output signal, said summed output signal being composed of a DC component and an AC component; and means for filtering said AC component from said summed output signal of said three-phase AC machine providing a filtered linear DC output signal, said means for filtering including at least four consecutive stages of filters, each of said stages of filters including an RC filter, said means for filtering capable of maintaining a ripple of about 1%.

2. The power sensor of claim 1 further comprising means for switching said filtered linear DC output signal from negative to positive in order to provide machine control.

3. The power sensor of claim 1 wherein the RC filter, of said means for filtering said AC component from said summed output signal is a voltage source driven RC filter.

* * * * *